(12) United States Patent
Tsuji et al.

(10) Patent No.: US 8,519,610 B2
(45) Date of Patent: Aug. 27, 2013

(54) ORGANIC LUMINESCENT ELEMENT

(75) Inventors: Hiroya Tsuji, Kyoto (JP); Norihiro Ito, Osaka (JP); Yuko Matsuhisa, Osaka (JP); Nobuhiro Ide, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/392,748

(22) PCT Filed: Sep. 1, 2010

(86) PCT No.: PCT/JP2010/064868
§ 371 (c)(1),
(2), (4) Date: Jun. 13, 2012

(87) PCT Pub. No.: WO2011/027754
PCT Pub. Date: Mar. 10, 2011

(65) Prior Publication Data
US 2012/0262053 A1 Oct. 18, 2012

(30) Foreign Application Priority Data

Sep. 1, 2009 (JP) ................................. 2009-201956

(51) Int. Cl.
*H01J 5/16* (2006.01)
(52) U.S. Cl.
USPC .......................................... 313/498; 313/503
(58) Field of Classification Search
USPC ............................... 313/495–512; 445/24, 25
See application file for complete search history.

(56) References Cited

U.S. PATENT DOCUMENTS

| 7,733,019 B2 | 6/2010 | Song et al. | |
| 2004/0189185 A1 * | 9/2004 | Yotsuya | 313/501 |
| 2005/0067944 A1 * | 3/2005 | Masuda et al. | 313/501 |
| 2005/0231085 A1 | 10/2005 | Song et al. | |
| 2006/0113898 A1 | 6/2006 | Toyoda | |
| 2010/0182222 A1 | 7/2010 | Ichihashi et al. | |

FOREIGN PATENT DOCUMENTS

| JP | 10-208875 | 8/1998 |
| JP | 2003-59642 | 2/2003 |
| JP | 2004-39500 | 2/2004 |
| JP | 2004-227940 | 8/2004 |
| JP | 2005-310749 | 11/2005 |
| JP | 2006-116706 | 5/2006 |
| JP | 2006-150707 | 6/2006 |
| JP | 2007-280699 | 10/2007 |
| WO | 2006-022273 | 3/2006 |

OTHER PUBLICATIONS

Japan Office action, mail date is Apr. 30, 2013.

\* cited by examiner

*Primary Examiner* — Anh Mai
*Assistant Examiner* — Elmito Breval
(74) *Attorney, Agent, or Firm* — Greenblum & Bernstein, P.L.C.

(57) ABSTRACT

An organic luminescent element comprises a substrate, an organic electroluminescence element formed on one surface thereof and having a light-emitting section emitting light to the substrate, and a lens attached on the other surface of the substrate. A refraction index of the lens is $\geqq$ that of the substrate. An area of the light-emitting section, parallel to the substrate's surface, is smaller than an area of the substrate on which the lens is attached. An angle θ between a line perpendicular to the substrate's surface in a direction from the light-emitting section toward the substrate and a straight line connecting an end of the light-emitting section and an end of the lens, is set to be $\geqq 60°$.

8 Claims, 3 Drawing Sheets

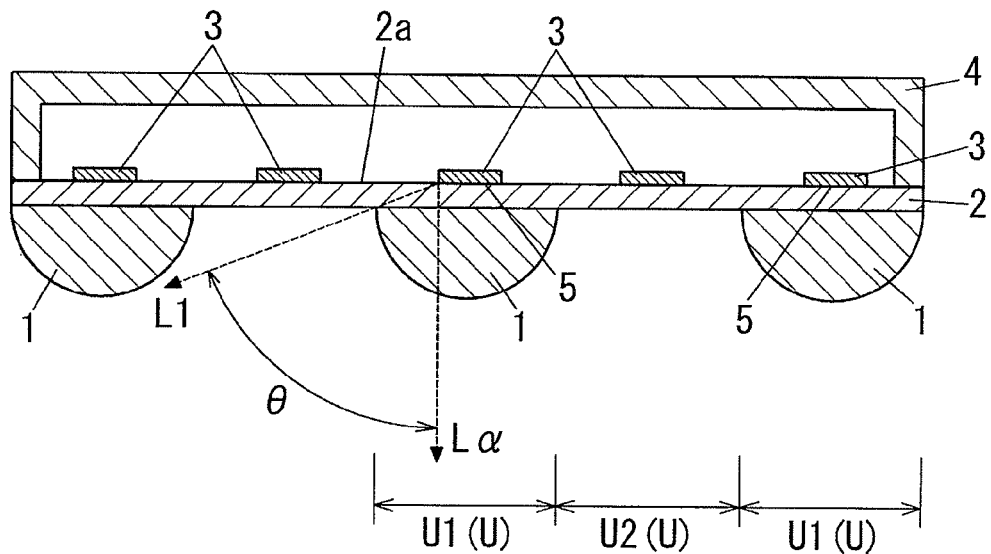
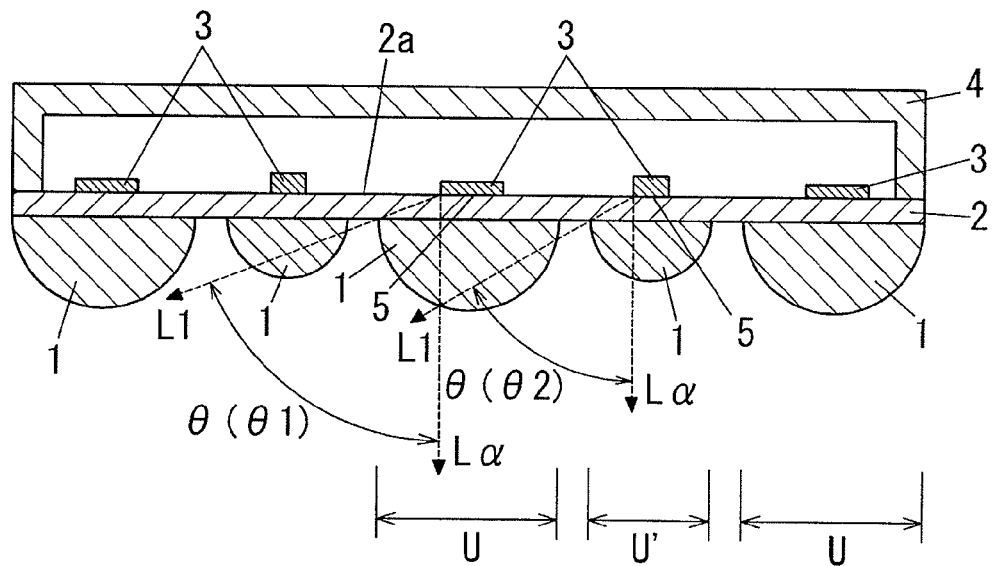

ORGANIC LUMINESCENT ELEMENT

TECHNICAL FIELD

The invention relates generally to organic luminescent elements and, more particularly, to an organic luminescent element using an organic electroluminescence element.

BACKGROUND ART

In recent years, an organic electroluminescence element, especially emitting white light, has become more efficient, and thus has been highly expected as a light source for the next generation which can replace a fluorescent being an existing major illumination lamp, or as a new illumination lamp for the next generation which could not be embodied by an existing light source.

However, if the organic electroluminescence element is used as illumination purpose, the efficiency is still insufficient. Thus, making higher efficient is required and becomes an issue.

In order to solve such an issue, there has been a development for efficiently extracting light emitted from the organic electroluminescence element. For example, an organic electroluminescence element having a transparent substrate is proposed in Japanese Patent Application Laid-Open No. 10-208875, and the transparent substrate is formed into a convex shape and is located with respect to each emission unit, and thereby the emitted light can be extracted more efficiently. However, total reflection at an interface between air and the substrate can not be prevented only by forming the substrate into the convex shape. Therefore, the above organic electroluminescence element can not obtain sufficient luminance efficiency as illumination purpose.

Also, a method for utilizing efficiently light emitted form an organic electroluminescence element is proposed in Japanese Patent Application Laid-Open No. 2004-39500. The organic electroluminescence element is provided in the side of its light-emitting surface with a microlens, and thereby the emitted light can be utilized efficiently. In this method, although light emitted in a center part of the microlens can be extracted efficiently, light emitted in the remaining part of the microlens can not be extracted due to total reflection at an interface between air and a surface of the microlens. As a result, making higher efficient has become an issue.

DISCLOSURE OF THE INVENTION

It is an object of the present invention to provide an efficient organic luminescent element, which can efficiently extract light emitted from an organic electroluminescence element outside the element.

An organic luminescent element of the present invention comprises a substrate 2, an organic electroluminescence element 3 formed on one surface of the substrate 2 and having a light-emitting section 5 emitting light to the substrate 2, and a lens 1 attached on the other surface of the substrate 2. A refraction index of the lens 1 is more than or equal to that of the substrate 2. According to a first aspect of the present invention, an area of a face of the light-emitting section 5, parallel to the substrate's surface, is set to be smaller than an area of the substrate 2, on which the lens 1 is attached. Then, an angle θ between a line Lα, perpendicular to the substrate's surface 2a in a direction from the light-emitting section 5 toward the substrate 2, and a straight line L1, connecting an end of the light-emitting section 5 and an end of the lens 1, is set to be more than or equal to 60°. In this invention, most of light emitted from the organic electroluminescence element can be extracted outside the element. Thus, an efficient organic luminescent element can be provided.

In an embodiment, the organic electroluminescence element 3 is configured to emit light in both a direction toward the substrate 2 and a direction opposite to the substrate 2, and the organic electroluminescence element 3 is provided on the side opposite to the substrate 2 with a lens structure section 6. In this invention, the organic electroluminescence element functions as a double-sided light emitting element, and then is sandwiched between lens structures, and thereby the lens structures are located in both light emission surface sides. Therefore, the emitted light can be extracted efficiently, and an efficient organic luminescent element can be provided.

In an embodiment, the refraction index of the lens 1 is more than that of the substrate 2. In this invention, since the refraction index of the lens is more than that of the substrate 2, total reflection at an interface between the substrate and the lens can be inhibited and thus an efficient organic luminescent element can be provided.

In an embodiment, the refraction indexes of the substrate 2 and the lens 1 are more than or equal to 1.7. In this invention, since the refraction indexes of the substrate and the lens are more than or equal to 1.7, total reflection at an interface between the substrate and an electrode of the organic electroluminescence element can be inhibited, and total reflection at an interface between the substrate and the lens can be inhibited. Thus, an efficient organic luminescent element can be provided.

In an embodiment, the light-emitting section 5 has a laminate structure and comprises a first contact surface contacting with the substrate's surface, and said first contact surface is parallel to the substrate's surface. The lens 1 comprises a second contact surface contacting with the substrate 2, and said second contact surface is parallel to the substrate 2. An area of said first contact surface is set to be smaller than that of said second contact surface. In this invention, the emitted light can be radiated efficiently toward the substrate 2 and the lens 1. Thus, an efficient organic luminescent element can be provided.

In an embodiment, said first and second contact surfaces are formed into similarity shapes each other. In this invention, these contact surfaces are formed into, for example, circular shapes, rectangular shapes or elliptical shapes each other, and thereby an efficient organic luminescent element can be provided, and further can be manufactured easily.

In an embodiment, an angle between a line Lα perpendicular to said first contact surface and a straight line L1, connecting left ends or right ends of said first and second contact surfaces, is more than or equal to 60°, in a cross-section formed by cutting the organic luminescent element in a vertical direction so as to pass through at least a part of said first contact surface. In this invention, most of light emitted from the organic electroluminescence element can be extracted outside the element. Thus, an efficient organic luminescent element can be provided.

In an embodiment, said first and second contact surfaces are formed into circular shapes, and the light-emitting section 5 is located so that an optical axis M1 coincides with a central axis of the lens 1. An angle between a line Lα perpendicular to said first contact surface and a straight line L1, connecting left ends or right ends of said first and second contact surfaces, is more than or equal to 60°, in a cross-section formed by cutting the organic luminescent element in a vertical direction along the optical axis M1. In this invention, most of light emitted from the organic electroluminescence element can be extracted outside the element more efficiently. Thus, an efficient organic luminescent element can be provided.

BRIEF DESCRIPTION OF THE DRAWINGS

Preferred embodiments of the invention will now be described in further details. Other features and advantages of the present invention will become better understood with regard to the following detailed description and accompanying drawings where:

FIG. 3 is a cross-sectional view showing yet another example of an organic luminescent element of the present invention;

FIG. 4 is a cross-sectional view showing yet another example of an organic luminescent element of the present invention.

BEST MODE FOR CARRYING OUT THE INVENTION

An organic luminescent element according to an embodiment of the present invention is explained below.

Figure 1:
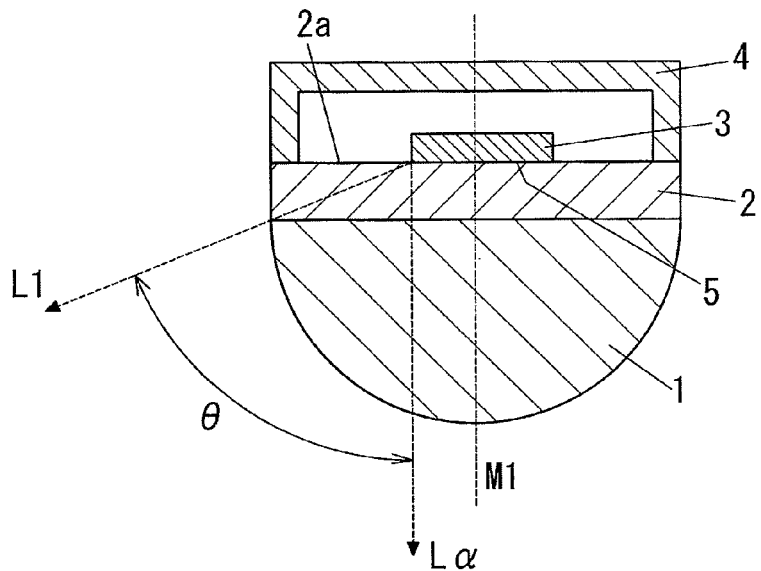
FIG. 1 is a cross-sectional view showing one example of an organic luminescent element of the present invention.

An example of an organic luminescent element of the present invention is shown in FIG. 1. The organic luminescent element comprises a substrate 2, an organic electroluminescence element 3 formed on one surface of the substrate 2, and a lens 1 attached on the other surface of the substrate 2 of the side opposite to said one surface of the substrate 2 on which the organic electroluminescence element 3 is formed. Then, the organic electroluminescence element 3 is sealed by a sealing portion 4.

A general lamination can be used as the organic electroluminescence element 3, and specifically, a luminous layer is sandwiched between an electrode located on one surface of the substrate 2 and a counter electrode facing this electrode. Then, as necessary, a hole transport layer, a hole injection layer, an electron transport layer, an electron injection layer, a carrier blocking layer and an intermediate layer are laminated between the electrode and the counter electrode, and such a lamination can be used. In addition, the detailed illustration and explanation of these layers are left out here. Preferably, a transparent electrode is used in the side for extracting light, with respect to the electrode and the counter electrode. The device structure and emission color of the organic electroluminescence element 3 are not particularly limited, and the organic electroluminescence element 3 can be formed by using general device structure and emission color, such as a single-layer device, a multi-unit device, a white light emitting device, a monochromatic light emitting device.

The organic electroluminescence element 3 has a light-emitting section 5, which emits light produced by the organic field response outward. Then, in the figure, the light-emitting section 5 is a surface of the organic electroluminescence element 3 contacting with the substrate 2. That is, in this organic electroluminescence element 3, the light-emitting section 5 is formed into a surface parallel to the substrate 2. Then, light emitted planarly from the light-emitting section 5 is radiated in a direction perpendicular to the substrate 2. In addition, if a surface-shaped portion of the luminous layer is different from that of the electrode located so as to contact with the substrate 2, the light-emitting section 5 is a surface portion of the luminous layer of the organic electroluminescence element 3 directly contacting with the substrate 2.

As long as good light emission efficiency can be obtained, a membrane structure (a surface shape) of the organic electroluminescence element 3 and a surface shape of the light-emitting section 5 are not particularly limited. Then, in order to obtain higher efficient property, a device is preferably designed to radiate more light outward. Specifically, the light-emitting section 5 can be formed into, for example, a circular shape, a square shape, a rectangular shape or an elliptical shape. Also, preferably, the light-emitting section 5 is set to be the same shape as a portion of the substrate 2 on which the lens 1 is attached and further an area of the light-emitting section 5 is set to be smaller than an area of said portion of the substrate 2 (that is, similarity shape each other). Therefore, from the aspect of easiness of device manufacturing, preferably, the portion of the substrate 2 on which the lens 1 is attached and the light-emitting section 5 are formed into circular shapes. At that time, preferably, the centers of these circles coincide with each other. When being formed into a circular shape, the light-emitting section 5 has a radius of 0.1 to 50 [mm] preferably, and thereby a higher efficient organic luminescent element can be provided. If the radius is smaller than this range, there is a possibility that high light emission can not be obtained. If the radius is larger than this range, there is a possibility that light emission property of the organic electroluminescence element 3 itself is reduced.

In order to extract light produced in the organic electroluminescence element 3 efficiently, a transparent substrate can be used as the substrate 2, and is formed with light transmissive material, such as glass, plastic. For example, a glass substrate or a transparent resin substrate can be used as the substrate 2.

Preferably, the substrate 2 has a thickness of 0.1 to 50 [mm]. Then, if the thickness is within this range, a higher efficient organic luminescent element can be provided. If the thickness is smaller than this range, there is a possibility that the intensity of the organic luminescent element becomes low. Meanwhile, if the thickness is larger than this range, light is absorbed into the substrate 2 and thereby there is a possibility that light can not be extracted efficiently.

As long as the lens 1 is a lens used for a luminescent element, the type of the lens 1 is not particularly limited. Then, for example, like a hemispherical lens and a convex lens, a surface of a lens parallel to the substrate 2 is formed into a circular shape, and such a lens can be used as the lens 1. Then, as long as light emitted from the organic electroluminescence element 3 can be extracted efficiently, the material of the lens 1 is not particularly limited. Then, various light transmissive materials, such as glass and plastic, can be used as the material of the lens 1.

When the lens 1 is a hemispherical lens, the lens 1 has a diameter of 0.1 to 50 [mm] preferably. If the diameter is within this range, a higher efficient organic luminescent element can be provided. If the diameter of the lens 1 is smaller than this range, the light-emitting section 5 also becomes reduced in size to satisfy a condition for an angle $\theta$ described hereinafter. Therefore, there is a possibility that high light emission can not be obtained. If the diameter of the lens 1 is larger than this range, the light-emitting section 5 becomes reduced in size relatively. Therefore, there is a possibility that high light emission can not be obtained. In addition, the lens 1 and the substrate 2 may be integrally formed by adhesion as a lens substrate, and thereby the organic luminescent element may be formed.

Then, as long as the organic electroluminescence element 3 can be sealed for the purpose of providing protection against outside, the sealing portion 4 is not particularly limited. Then, the organic electroluminescence element 3 may be sealed by using a sealing glass or a plastic sealing material. In the configuration shown in the figure, the sealing portion 4 opens at its lower surface, and is formed into an U-shape in cross-section, and is located on a surface of the substrate 2 so that a position of an end of the sealing portion 4 coincides with a position of an end of the lens 1 through both sides of the substrate 2.

In the organic luminescent element of the present invention, an area of a surface of the light-emitting section 5 parallel to the substrate's surface (the light-emitting section's area) is set to be smaller than an area of the substrate 2 on which the lens 1 is attached (the lens attachment area). That is, an area of a surface of the light-emitting section 5 (a first contact surface) contacting with one surface of the substrate 2, parallel to said one surface, is set to be smaller than an area of a surface of the lens 1 (a second contact surface) contacting with the substrate 2, parallel to the substrate 2. Then, an angle between a line $L\alpha$, perpendicular to a substrate's surface $2a$ (or the first contact surface) in a direction from the light-emitting section 5 toward the substrate 2, and a straight line L1, connecting an end of the light-emitting section 5 and an end of the lens, is set to be more than or equal to 60°. Thus, the organic luminescent element can prevent that light emitted from the organic electroluminescence element 3 is consumed without being extracted outward, and then most of light emission can be extracted outside the element. Accordingly, high efficient light emission can be obtained.

In particular, if the first and second contact surfaces are formed into circular shapes and the light-emitting section 5 is located so that its optical axis M1 coincides with a central axis of the lens 1, as shown in FIG. 1, higher efficient light emission can be obtained. In this case, as shown in FIG. 1, preferably, an angle $\theta$ between a line $L\alpha$ perpendicular to the first contact surface and a straight line L1, connecting left ends of the first and second contact surfaces, is more than or equal to 60°, in a cross-section formed by cutting the organic luminescent element in a vertical direction along the optical axis M1, shown in FIG. 1.

When the lens attachment area shall be 100%, the light-emitting section's area is less than 100%, and preferably, is more than or equal to 5%, and more preferably, is within a range of 10 to 80%. If the light-emitting section's area is too small in relation to the lens attachment area, there is a possibility that light emission can not be sufficiently extracted outside. If the light-emitting section's area is too close to the lens attachment area, the angle $\theta$ can not be remained to be more than or equal to 60° and thus there is a possibility that light can not be extracted efficiently.

Then, preferably, the angle $\theta$ between the line $L\alpha$ perpendicular to the substrate's surface $2a$ in a direction from the light-emitting section 5 toward the substrate 2, and the straight line L1, connecting an end of the light-emitting section 5 and an end of the lens, is more than or equal to 60° and less than or equal to 90°, and more preferably, is within a range of 70° to 90°. Thus, light can be extracted more efficiently by setting the angle $\theta$ within this range.

Then, the refraction index of the lens 1 is more than or equal to that of the substrate 2, and more preferably, the refraction index of the lens 1 is more than that of the substrate 2. Therefore, the organic luminescent element can prevent that light is not extracted outside by total reflection of light emitted in an interface between the substrate 2 and the lens 1, and then light can be extracted outside efficiently. If the refraction index of the lens 1 is smaller than that of the substrate 2, light extraction efficiency is reduced.

Then, preferably, the refraction indexes of the substrate 2 and the lens 1 are more than or equal to 1.7. Therefore, the organic luminescent element can prevent that light is not extracted outside due to total reflection of light emitted in an interface between the substrate 2 and an electrode of the organic electroluminescence element 3 or due to total reflection of light emitted in an interface between the substrate 2 and the lens 1. Thus, light can be extracted outside more efficiently. Specifically, for example, the refraction index of the substrate 2 can be set to be within a range of 1.7 to 1.9, and the refraction index of the lens 1 can be set to be within a range of 1.7 to 1.9.

Figure 2:
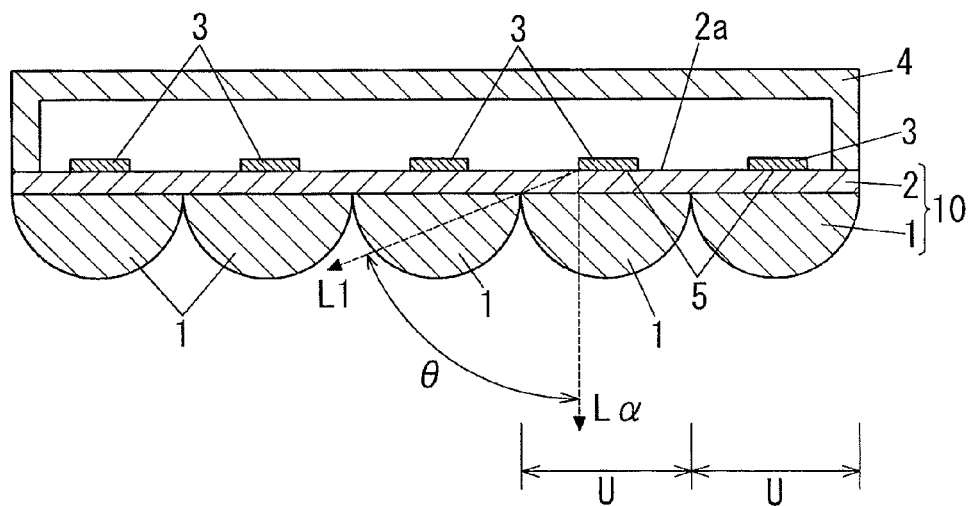
FIG. 2 is a cross-sectional view showing another example of an organic luminescent element of the present invention.

FIG. 2 shows another example of the organic luminescent element of the present invention. In this organic luminescent element, a plurality of lenses 1 are attached on one surface of the substrate 2 at regular intervals and thereby a lens array substrate 10 is formed, and then a plurality of organic electroluminescence elements 3 are located on the other surface of the substrate 2 of the side opposite to said one surface of the substrate 2 on which the plurality of lenses 1 are attached, at regular intervals. In this time, an organic electroluminescence element 3 is placed at a position corresponding to each lens 1. That is, the organic electroluminescence elements 3 have the same number of the lenses 1, and each organic electroluminescence element 3 is located so that its center coincides with the center of the corresponding lens 1 (in a face parallel to the substrate 2). Then, a lens 1 and an adjacent lens 1 are located so as to contact in each other's edges. The plurality of organic electroluminescence elements 3 may be sealed together by one sealing portion 4, as shown in the figure, and each organic electroluminescence element 3 may be sealed, individually.

Each light emission unit U comprises one organic electroluminescence element 3, the corresponding lens 1 facing the element 3 and a part of the substrate 2 sandwiched between the element 3 and the corresponding lens 1, and then is configured like the configuration shown in FIG. 1. That is, in each light emission unit U, the light-emitting section's area is set to be smaller than the lens attachment area, and then the angle $\theta$ between the line $L\alpha$ perpendicular to the substrate's surface $2a$ in a direction from the light-emitting section 5 toward the substrate 2, and the straight line L1, connecting an end of the light-emitting section 5 and an end of the lens, is set to be more than or equal to 60°. Therefore, light emitted from each light emission unit can be extracted efficiently. Here, a light emission unit U functions as a pixel of the luminescent element. In the configuration shown in the figure, light is extracted from the plurality of light-emitting sections 5 by using the lens array substrate 10. Thus, light of each light emission unit U can be extracted efficiently and a high efficient organic luminescent element can be provided. In particular, when the same emission color is used in each light emission unit U, an extremely-high efficient organic luminescent element can be provided.

FIG. 3 shows yet another example of the organic luminescent element of the present invention. In this organic luminescent element, a plurality of organic electroluminescence elements 3 are located on one surface of the substrate 2 at regular intervals, and a plurality of lenses 1 are located so as to correspond to some of the plurality of organic electroluminescence elements 3 on the other surface of the substrate 2 of the side opposite to said one surface of the substrate 2 on which the elements 3 are located. That is, the number of the plurality of lenses 1 is less than that of the plurality of organic electroluminescence elements 3, and each lens 1 is located so that its center coincides with the center of the corresponding organic electroluminescence element 3 (in a face parallel to the substrate 2). The plurality of lenses 1 may be located at regular intervals so as to correspond to a plurality of organic electroluminescence elements 3 while skipping at least one organic electroluminescence element 3, or the plurality of lenses 1 may be located not at regular intervals but at desired positions. The sealing portion 4 can be configured like the configuration shown in FIG. 2.

Each of light emission units U comprises an organic electroluminescence element 3 and a part of the substrate 2 provided with the organic electroluminescence element 3. Then, light emission units U1 of the light emission units U are provided with lenses 1 located on a surface of the substrate 2 on the side opposite to the organic electroluminescence elements 3, and then each light emission unit U1 is configured like the configuration shown in FIG. 1. That is, in each light emission unit U1, the light emitting section's area is set to be smaller than the lens attachment area, and then the angle θ between the line Lα perpendicular to the substrate's surface 2a in a direction from the light-emitting section 5 toward the substrate 2, and the straight line L1, connecting an end of the light-emitting section 5 and an end of the lens, is set to be more than or equal to 60°. Thus, light emitted from each light emission unit U1 can be extracted efficiently. Meanwhile, light emission units U2 of the light emission units U are not provided with lenses 1, and thereby light passing through the substrate 2 is directly radiated outside. In the configuration shown in the figure, the lenses 1 are located only in particular light emission units U requiring high light extraction efficiency. Therefore, light can be extracted efficiently, and a high efficient organic luminescent element can be provided.

FIG. 4 shows yet another example of the organic luminescent element of the present invention. In this organic luminescent element, variously-sized organic electroluminescence elements 3 (variously-sized light emitting section's areas) are located on one surface of the substrate 2, and then variously-sized lenses 1 (variously-sized lens attachment areas) are located so as to correspond to the organic electroluminescence elements 3 on the other surface of the substrate 2 of the side opposite to said one surface of the substrate 2 on which the organic electroluminescence elements 3 are located. In the configuration shown in the figure, the organic electroluminescence elements 3 and the lenses 1 are located at regular intervals so that the center of each element 3 coincides with the center of the corresponding lens 1 (in a face parallel to the substrate 2). Then, large-sized lenses 1 are assigned to large-sized organic electroluminescence elements 3, and small-sized lenses 1 are assigned to small-sized organic electroluminescence elements 3.

Each of light emission units U comprises an organic electroluminescence element 3, a lens 1 and a part of the substrate 2 sandwiched therebetween. Then, both light emission units U including large-sized light-emitting sections 5 and light emission units U including small-sized light-emitting sections 5 are configured like the configuration shown in FIG. 1. That is, in each light emission unit U, the light-emitting section's area is set to be smaller than the lens attachment area, and then the angle θ between the line Lα perpendicular to the substrate's surface 2a in a direction from the light-emitting section 5 toward the substrate 2, and the straight line L1, connecting an end of the light-emitting section 5 and an end of the lens, is set to be more than or equal to 60°. Thus, light emitted from each light emission unit U can be extracted efficiently. Here, an angle θ (θ1) in a light emission unit U comprising a large-sized lens 1 may be equal to or different from an angle θ (θ2) in a light emission unit U' comprising a small-sized lens 1. In the configuration shown in the figure, the organic luminescent element can be configured by adjusting areas of light-emitting sections 5 and sizes of lenses 1 and by combining variously-sized light emission units U. Therefore, a high efficient organic luminescent element can be provided.

Figure 5:
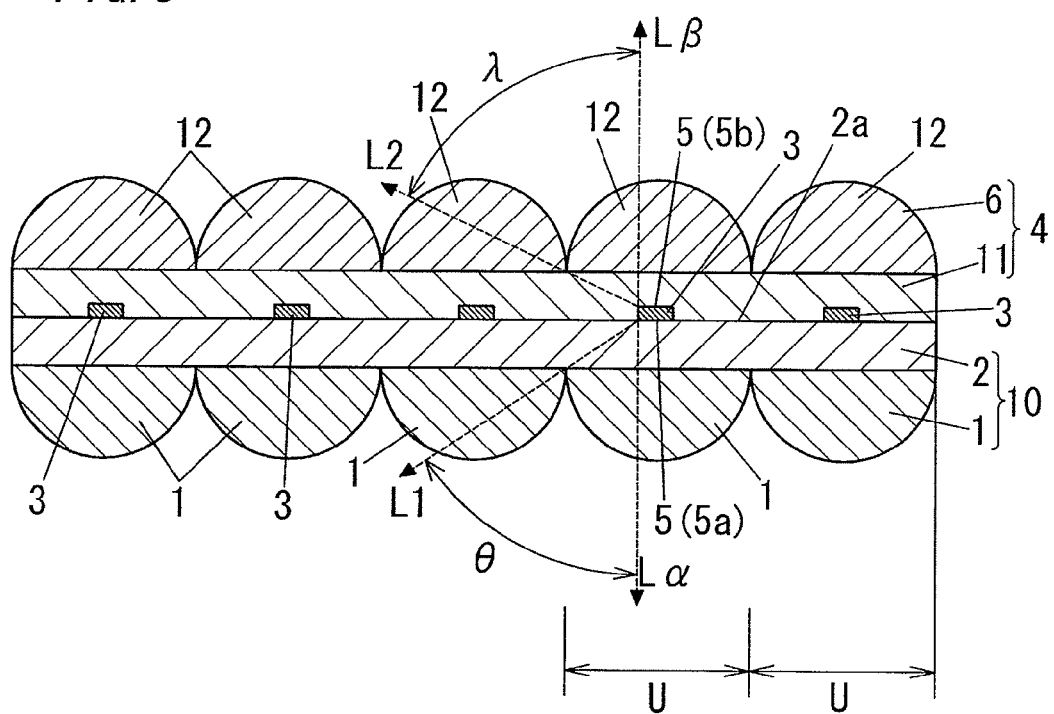
FIG. 5 is a cross-sectional view showing yet another example of an organic luminescent element of the present invention.

FIG. 5 shows yet another example of the organic luminescent element of the present invention. In this organic luminescent element, organic electroluminescence elements 3 function as double-sided light emitting elements, which can emit light in a direction toward the substrate 2 and in a direction opposite to the substrate 2. That is, light-emitting sections 5 are formed in both sides of the element 3, and a light-emitting section 5a is located in the substrate side and a light-emitting section 5b is located in the side opposite to the substrate. The configuration comprising the substrate 2, the lens 1 and the organic electroluminescence element 3 is the same as the configuration shown in FIG. 2. That is, in the organic luminescent element, a plurality of lenses 1 are attached to one surface of the substrate 2 at regular intervals and thereby a lens array substrate 10 is formed. Then, a plurality of organic electroluminescence elements 3 are located at regular intervals so as to correspond to each lens 1 on the other surface of the substrate 2 of the side opposite to said one surface of the substrate 2 on which the lenses 1 are attached. Then, the center of each organic electroluminescence element 3 coincides with the center of the corresponding lens 1.

Then, the configuration shown in FIG. 5 is different from the above-mentioned configurations, and the sealing section 4 comprises a sealing resin section 11 which closes around and seals the organic electroluminescence elements 3, and a lens structure section 6 which is located on a surface of the sealing resin section 11 on the side opposite to the substrate 2. A liquid sealing resin covers the organic electroluminescence elements 3 and then cures, and thereby the sealing resin section 11 is formed. Then, said surface of the side opposite to the substrate 2 is about flat. The lens structure section 6 comprises a plurality of lens bodies 12, which are located on said surface of the sealing resin section 11 at regular intervals. The center of each lens body 12 coincides with the center of the corresponding organic electroluminescence element 3. That is, the center of the lens body 12 also coincides with the center of the corresponding lens 1. A glass lens or a resin lens can be used as the lens body 12. The lens body 12 can be formed with the same material as the lens 1. Then, each lens body 12 may be formed so that its size is about equal to or different from a size of the lens 1.

In this configuration, each of light emission units U comprises an organic electroluminescence element 3, a lens 1, a lens body 12, and a part of the substrate 2 and a part of the sealing resin section 11 which are sandwiched between the lens 1 and the lens body 12. In each light emission unit U, the configuration of the side of the substrate 2 with the lenses 1 is the same as configuration shown in FIG. 1. That is, in each light emission unit U, the light emitting section's area of the light-emitting section 5a is set to be smaller than the lens attachment area of the lens 1, and then the angle θ between the line Lα perpendicular to the substrate's surface 2a in a direction from the light-emitting section 5a toward the substrate 2, and the straight line L1, connecting an end of the light-emitting section 5a and an end of the lens, is set to be more than or equal to 60°. Thus, light emitted from each light emission unit U can be extracted to the substrate's side efficiently.

Further, in the figure, the configuration of the side of the organic electroluminescence element 3 with the lens body 12 also has the same as configuration explained above. That is, in each light emission unit U, the light emitting section's area of the light-emitting section 5b (a surface's area of the light-emitting section 5b parallel to the substrate's surface) is set to be smaller than the lens attachment area of the lens body 12 (an area of the sealing resin section 11 on which the lens body 12 is attached), and then an angle λ between a line Lβ perpendicular to the substrate's surface 2a in a direction from the light-emitting section 5b toward the lens body 12, and the straight line L2, connecting an end of the light-emitting section 5b and an end of the lens body 12, is set to be more than or equal to 60°. Therefore, light emitted from each light emission unit U can be extracted to the side opposite to the substrate 2 efficiently.

As explained above, in the configuration shown in the figure, the organic electroluminescence element 3 is sandwiched between the lens structures located in both light emission surface sides, and thereby functions as a double-sided light emitting element. Therefore, the emitted light can be extracted efficiently, and an efficient organic luminescent element can be provided.

Practical Example 1

At first, ITO (Indium Tin Oxide, a sheet resistance of 12[Ω/□]) having a thickness of 1100 [Å] was formed on one side of a glass substrate (a refractive index of 1.51) having a thickness of 0.5 [mm], and thereby a glass substrate with ITO was provided. The glass substrate with ITO was processed by ultrasonic cleaning with deionized water during ten minutes, and then by ultrasonic cleaning with acetone during ten minutes, and then by ultrasonic cleaning with isopropyl alcohol during ten minutes. After that, the glass substrate with ITO was processed by steam cleaning with isopropyl alcoholic vapor during two minutes, and then was dried, and further was processed by ultraviolet ozone washing during ten minutes.

Then, the glass substrate with ITO was put in a vacuum evaporation system, and a co-deposition film of molybdenum oxide ($MoO_3$) and α-NPD was deposited as a hole injection layer under reduce pressure of $5*10^{-5}$ [Pa], and the co-deposition film had a thickness of 100 [Å] and a ratio between $MoO_3$ and α-NPD was 1:1. Then, α-NPD having a thickness of 300 [Å] was deposited as a hole transport layer, and then a green phosphorescence luminescent layer, provided by doping $Ir(ppy)_3$ of 10% into CBP, having a thickness of 300 [Å] was deposited as a luminescent layer. Then, $Alq_3$ having a thickness of 500 [Å] was deposited as an electron transport layer. Then, LiF having a thickness of 5 [Å] was deposited on that. Finally, Al having a thickness of 1000 [Å] was deposited. In this way, an organic electroluminescence element was produced. A light-emitting section was formed into a circular shape having a radius of 1.5 [mm] and its area was about 7.07 [$mm^2$].

A hemispherical lens (a refractive index of 1.51) having a diameter of 5 [mm] was adhered by using a liquid adhesion bond having a refractive index of 1.51 on a surface of the side opposite to a surface of the glass substrate where the organic electroluminescence element was produced. An attachment area of the hemispherical lens was about 19.6 [$mm^2$]. When the hemispherical lens was adhered on the glass substrate, the hemispherical lens was adjusted so that the center of its circle coincides with the center of the light-emitting section's circle. Then, a produced organic luminescent element was sealed in a nitrogen atmosphere. As explained above, an organic luminescent element was produced.

Practical Example 2

A light-emitting section was formed into a circular shape having a radius of 0.5 [mm] (its area was about 0.785 [$mm^2$]).

In regard to the rest, an organic luminescent element was produced like the Practical Example 1. That is, an organic electroluminescence element was formed on a surface of a glass substrate so as to have the same layer configuration, and then a hemispherical lens (a refractive index of 1.51) having a diameter of 5 [mm] was adhered by using a liquid adhesion bond having a refractive index of 1.51 on the glass substrate, and the hemispherical lens was adjusted so that the center of its circle coincides with the center of the light-emitting section's circle, and thereby an organic luminescent element was produced.

Practical Example 3

ITO (a sheet resistance of 12[Ω/□]) having a thickness of 1100 [Å] was formed on one side of a glass substrate (a refractive index of 1.75) having a thickness of 0.5 [mm] and thereby a glass substrate with ITO was provided. Then, an organic electroluminescence element was produced like the layer configuration of the Practical Example 1 (a light-emitting section: a circular shape having a radius of 1.5 [mm] and an area of about 7.07 [$mm^2$]).

A hemispherical lens (a refractive index of 1.75) having a diameter of 5 [mm] was adhered by using a liquid adhesion bond having a refractive index of 1.75 on a surface of the side opposite to a surface of the glass substrate where the organic electroluminescence element was produced. An attachment area of the hemispherical lens was about 19.6 [$mm^2$]. When the hemispherical lens was adhered on the glass substrate, the hemispherical lens was adjusted so that the center of its circle coincides with the center of the light-emitting section's circle. As explained above, an organic luminescent element was produced.

Practical Example 4

ITO (a sheet resistance of 12[Ω/□]) having a thickness of 1100 [Å] was formed on one side of a glass substrate (a refractive index of 1.90) having a thickness of 0.5 [mm] and thereby a glass substrate with ITO was provided. Then, an organic electroluminescence element was produced like the layer configuration of the Practical Example 1 (a light-emitting section: a circular shape having a radius of 1.5 [mm] and an area of about 7.07 [$mm^2$]).

A hemispherical lens (a refractive index of 1.90) having a diameter of [mm] was adhered by using a liquid adhesion bond having a refractive index of 1.90 on a surface of the side opposite to a surface of the glass substrate where the organic electroluminescence element was produced. An attachment area of the hemispherical lens was about 19.6 [$mm^2$]. When the hemispherical lens was adhered on the glass substrate, the hemispherical lens was adjusted so that the center of its circle coincides with the center of the light-emitting section's circle. As explained above, an organic luminescent element was produced.

Practical Example 5

ITO (a sheet resistance of 12[Ω/□]) having a thickness of 1100 [Å] was formed on one side of a glass substrate (a refractive index of 1.51) having a thickness of 0.5 [mm] and thereby a glass substrate with ITO was provided. Then, an organic electroluminescence element was produced like the layer configuration of the Practical Example 1 (a light-emitting section: a circular shape having a radius of 1.5 [mm] and an area of about 7.07 [$mm^2$]).

A hemispherical lens (a refractive index of 1.75) having a diameter of 5 [mm] was adhered by using a liquid adhesion bond having a refractive index of 1.75 on a surface of the side opposite to a surface of the glass substrate where the organic electroluminescence element was produced. An attachment area of the hemispherical lens was about 19.6 [mm$^2$]. When the hemispherical lens was adhered on the glass substrate, the hemispherical lens was adjusted so that the center of its circle coincides with the center of the light-emitting section's circle. As explained above, an organic luminescent element was produced.

Practical Example 6

ITO (a sheet resistance of 12[Ω/□]) having a thickness of 1100 [Å] was formed on one side of a glass substrate (a refractive index of 1.51) having a thickness of 0.5 [mm] and thereby a glass substrate with ITO was provided. Then, an organic electroluminescence element was produced like the layer configuration of the Practical Example 1 (a light-emitting section: a circular shape having a radius of 1.5 [mm] and an area of about 7.07 [mm$^2$]).

A hemispherical lens (a refractive index of 1.90) having a diameter of 5 [mm] was adhered by using a liquid adhesion bond having a refractive index of 1.90 on a surface of the side opposite to a surface of the glass substrate where the organic electroluminescence element was produced. An attachment area of the hemispherical lens was about 19.6 [mm$^2$]. When the hemispherical lens was adhered on the glass substrate, the hemispherical lens was adjusted so that the center of its circle coincides with the center of the light-emitting section's circle. As explained above, an organic luminescent element was produced.

Practical Example 7

ITO (a sheet resistance of 12[Ω/□]) having a thickness of 1100 [Å] was formed on one side of a glass substrate (a refractive index of 1.51) having a thickness of 0.5 [mm] and thereby a glass substrate with ITO was provided. Then, by using the same method as the Practical Example 1, the deposition to a luminescent layer was processed. Then, on the luminescent layer, Alq$_3$ having a thickness of 300 [Å] was deposited as an electron transport layer. Then, a co-deposition layer of Alq$_3$ and Li having a thickness of 200 [Å] was deposited on that. Then, by using sputtering method, IZO was deposited as a negative electrode on that. In this way, an organic electroluminescence element was produced as a double-sided light emitting element.

A hemispherical lens (a refractive index of 1.51) having a diameter of 5 [mm] was adhered by using a liquid adhesion bond having a refractive index of 1.51 on a surface of the side opposite to a surface of the glass substrate where the organic electroluminescence element was produced. An attachment area of the hemispherical lens was about 19.6 [mm$^2$]. When the hemispherical lens was adhered on the glass substrate, the hemispherical lens was adjusted so that the center of its circle coincides with the center of the light-emitting section's circle.

In addition, a glass substrate, provided on its surface with a lens structure, was adhered by using UV cured resin having a refractive index of 1.51 on the surface of the glass substrate where the organic electroluminescence element was produced, and then a sealing portion was provided with lens structure sections, and was formed. A hemispherical lens was used as a lens structure section, and an attachment part of the hemispherical lens was formed into a circle having a diameter of 5 [mm]. When being adhered, each lens structure section was adjusted so that the center of its circle coincides with the center of the light-emitting section's circle. As explained above, an organic luminescent element was produced as a double-sided light emitting element.

Reference Example 1

An organic electroluminescence element was produced, like the Practical Example 1, and then the characteristic evaluation was performed without adhesion of a hemispherical lens.

Comparative Example 1

A light-emitting section was formed into a circular shape having a radius of 2 [mm] (an area of about 12.56 [mm$^2$]). In regard to the rest, an organic luminescent element was produced like the Practical Example 1. That is, an organic electroluminescence element was formed on a surface of a glass substrate so as to have the same layer configuration, and then a hemispherical lens (a refractive index of 1.51) having a diameter of 5 [mm] was adhered by using a liquid adhesion bond having a refractive index of 1.51 on the glass substrate, and the hemispherical lens was adjusted so that the center of its circle coincides with the center of the light-emitting section's circle, and thereby an organic luminescent element was produced.

Comparative Example 2

A light-emitting section was formed into a circular shape having a radius of 2.5 [mm] (a diameter of 5 [mm]) (an area of about 19.6 [mm$^2$]). In regard to the rest, an organic luminescent element was produced like the Practical Example 1. That is, an organic electroluminescence element was formed on a surface of a glass substrate so as to have the same layer configuration, and then a hemispherical lens (a refractive index of 1.51) having a diameter of 5 [mm] was adhered by using a liquid adhesion bond having a refractive index of 1.51 on the glass substrate, and the hemispherical lens was adjusted so that the center of its circle coincides with the center of the light-emitting section's circle, and thereby an organic luminescent element was produced.

Comparative Example 3

ITO (a sheet resistance of 12[Ω/□]) having a thickness of 1100 [Å] was formed on one side of a glass substrate (a refractive index of 1.90) having a thickness of 0.5 [mm] and thereby a glass substrate with ITO was provided. Then, an organic electroluminescence element was produced so as to have the same layer configuration as the Practical Example 1 (a light-emitting section: a circular shape having a radius of 1.5 [mm], an area of about 7.07 [mm$^2$]).

A hemispherical lens (a refractive index of 1.51) having a diameter of 5 [mm] was adhered by using a liquid adhesion bond having a refractive index of 1.51 on a surface of the side opposite to a surface of the glass substrate where the organic electroluminescence element was produced. An attachment area of the hemispherical lens was about 19.6 [mm$^2$]. When the hemispherical lens was adhered on the glass substrate, the hemispherical lens was adjusted so that the center of its circle coincides with the center of the light-emitting section's circle. As explained above, an organic luminescent element was produced.

Comparative Example 4

ITO (a sheet resistance of 12[Ω/□]) having a thickness of 1100 [Å] was formed on one side of a glass substrate (a refractive index of 1.90) having a thickness of 0.5 [mm] and thereby a glass substrate with ITO was provided. Then, an organic electroluminescence element was produced so as to have the same layer configuration as the Practical Example 1 (a light-emitting section: a circular shape having a radius of 1.5 [mm], an area of about 7.07 [mm²]).

A hemispherical lens (a refractive index of 1.75) having a diameter of 5 [mm] was adhered by using a liquid adhesion bond having a refractive index of 1.75 on a surface of the side opposite to a surface of the glass substrate where the organic electroluminescence element was produced. An attachment area of the hemispherical lens was about 19.6 [mm²]. When the hemispherical lens was adhered on the glass substrate, the hemispherical lens was adjusted so that the center of its circle coincides with the center of the light-emitting section's circle. As explained above, an organic luminescent element was produced.

(Characteristic Evaluation)

The following [Table 1] lists an external quantum efficiency, an angle θ (angle between the line Lα perpendicular to the substrate's surface 2a in a direction from the light-emitting section toward the substrate, and the straight line L1 connecting an end of the light-emitting section and an end of the lens), a refractive index of the substrate, and a refractive index of the lens in each example. The external quantum efficiency is a result of an angle resolution measured under a current density of 2 [mA/cm²].

In the Practical Example 1, a high efficient organic luminescent element could be provided by setting the angle θ into 64°, as compared with the Comparative Examples 1 and 2. In the Practical Example 2, a higher efficient organic luminescent element could be provided by setting the angle θ into 76°. In the Practical Example 3, a high efficient organic luminescent element could be provided by setting the angle θ into 64° and by setting the refractive indexes of the lens and the substrate into more than or equal to 1.7. In the Practical Example 4, a high efficient organic luminescent element could be provided by setting the angle θ into 64° and by setting the refractive indexes of the lens and the substrate into 1.9. In the Practical Examples 5 and 6, a high efficient organic luminescent element could be provided by setting the angle θ into 64° and by setting the refractive index of the lens into more than the refractive index of the substrate. In the Practical Example 7, a high efficient organic luminescent element could be provided by setting the angles θ and λ into 64° and by locating lens structures in both light emission surface sides of the double-sided light emitting element.

TABLE 1

| | ANGLE θ (°) | REFRACTIVE INDEX OF SUBSTRATE | REFRACTIVE INDEX OF LENS | EXTERNAL QUANTUM EFFICIENCY (%) |
|---|---|---|---|---|
| PRACTICAL EXAMPLE 1 | 64 | 1.51 | 1.51 | 17.5 |
| PRACTICAL EXAMPLE 2 | 76 | 1.51 | 1.51 | 19.1 |
| PRACTICAL EXAMPLE 3 | 64 | 1.75 | 1.75 | 29.1 |
| PRACTICAL EXAMPLE 4 | 64 | 1.90 | 1.90 | 31.0 |
| PRACTICAL EXAMPLE 5 | 64 | 1.51 | 1.75 | 18.8 |
| PRACTICAL EXAMPLE 6 | 64 | 1.51 | 1.90 | 17.9 |
| PRACTICAL EXAMPLE 7 | 64 | 1.51 | 1.51 | 18.1 |

TABLE 1-continued

| | ANGLE θ (°) | REFRACTIVE INDEX OF SUBSTRATE | REFRACTIVE INDEX OF LENS | EXTERNAL QUANTUM EFFICIENCY (%) |
|---|---|---|---|---|
| REFERENCE EXAMPLE 1 | — | 1.51 | — | 9.7 |
| COMPARATIVE EXAMPLE 1 | 45 | 1.51 | 1.51 | 14.5 |
| COMPARATIVE EXAMPLE 2 | 0 | 1.51 | 1.51 | 12.3 |
| COMPARATIVE EXAMPLE 3 | 64 | 1.90 | 1.51 | 8.9 |
| COMPARATIVE EXAMPLE 4 | 64 | 1.90 | 1.75 | 9.1 |

Although the present invention has been described with reference to certain preferred embodiments, numerous modifications and variations can be made by those skilled in the art without departing from the true spirit and scope of this invention, namely claims.

The invention claimed is:

1. An organic luminescent element comprising:
   a substrate;
   an organic electroluminescence element formed on one surface of said substrate, and having a light-emitting section emitting light to said substrate; and
   a lens attached on the other surface of said substrate, and a refraction index of said lens being more than or equal to that of said substrate,
   wherein an area of a face of said light-emitting section, parallel to said substrate's surface, is set to be smaller than an area of said substrate, on which said lens is attached,
   wherein an angle between a line, perpendicular to said substrate's surface in a direction from said light-emitting section toward said substrate, and a straight line, connecting an end of said light-emitting section and an end of said lens, is set to be more than or equal to 60°.

2. The organic luminescent element as claimed in claim 1, wherein said organic electroluminescence element is configured to emit light in both a direction toward said substrate and a direction opposite to said substrate,
   wherein said organic electroluminescence element is provided on the side opposite to said substrate with a lens structure section.

3. The organic luminescent element as claimed in claim 1, wherein the refraction index of said lens is more than that of said substrate.

4. The organic luminescent element as claimed in claim 1, wherein the refraction indexes of said substrate and said lens are more than or equal to 1.7.

5. The organic luminescent element as claimed in claim 1, wherein said light-emitting section has a laminate structure and comprises a first contact surface contacting with said substrate's surface, said first contact surface being parallel to said substrate's surface,
   wherein said lens comprises a second contact surface contacting with said substrate, said second contact surface being parallel to said substrate,
   wherein an area of said first contact surface is set to be smaller than that of said second contact surface.

6. The organic luminescent element as claimed in claim 5, wherein said first and second contact surfaces are formed into similarity shapes each other.

7. The organic luminescent element as claimed in claim 5, wherein an angle between a line perpendicular to said first contact surface and a straight line, connecting left ends or right ends of said first and second contact surfaces, is more than or equal to 60°, in a cross-section formed by cutting the organic luminescent element in a vertical direction so as to pass through at least a part of said first contact surface.

8. The organic luminescent element as claimed in claim 5, wherein said first and second contact surfaces are formed into circular shapes,
wherein said light-emitting section is located so that an optical axis coincides with a central axis of said lens,
wherein an angle between a line perpendicular to said first contact surface and a straight line, connecting left ends or right ends of said first and second contact surfaces, is more than or equal to 60°, in a cross-section formed by cutting the organic luminescent element in a vertical direction along said optical axis.

* * * * *